US011315009B2

(12) United States Patent
Buchanan et al.

(10) Patent No.: US 11,315,009 B2
(45) Date of Patent: Apr. 26, 2022

(54) ANALOG MULTIPLIER-ACCUMULATORS

(71) Applicant: HEWLETT PACKARD ENTERPRISE DEVELOPMENT LP, Houston, TX (US)

(72) Inventors: Brent Buchanan, Palo Alto, CA (US); Miao Hu, Palo Alto, CA (US); John Paul Strachan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 1209 days.

(21) Appl. No.: 15/449,071

(22) Filed: Mar. 3, 2017

(65) Prior Publication Data

US 2018/0253643 A1    Sep. 6, 2018

(51) Int. Cl.
*G06N 3/063* (2006.01)
*G11C 13/00* (2006.01)
(Continued)

(52) U.S. Cl.
CPC ......... *G06N 3/0635* (2013.01); *G06F 7/5443* (2013.01); *G11C 13/0069* (2013.01);
(Continued)

(58) Field of Classification Search
CPC ...... G06N 3/0635; G06N 7/046; G06F 7/523; G06F 2207/4824; G06F 7/5443
See application file for complete search history.

(56) References Cited

U.S. PATENT DOCUMENTS 8,856,055 B2   10/2014  Brezzo et al.
9,489,618 B2   11/2016  Roy et al.
(Continued)

FOREIGN PATENT DOCUMENTS

CN    104978996 A    10/2015
CN    105552222 A     5/2016
(Continued)

OTHER PUBLICATIONS

Qureshi, "CMOS Interface Circuits for Reading and Writing Memristor Crossbar Array" (Year: 2011).*
(Continued)

*Primary Examiner* — Abdullah Al Kawsar
*Assistant Examiner* — Tewodros E Mengistu
(74) *Attorney, Agent, or Firm* — Hewlett Packard Enterprise Patent Department

(57) ABSTRACT

An example electronic device includes a crossbar array, row driver circuitry, and column output circuits for each of the column lines of the crossbar array. The crossbar array may include row lines, column lines, and memristors that each are connected between one of the row lines and one of the column lines. The row driver circuitry may be to apply a plurality of analog voltages to a first node during a plurality of time periods, respectively, and, for each of the row lines, selectively connect the row line to the first node during one of the plurality of time periods based on a digital input vector. The column output circuits may each include: an integration capacitor, a switch that is controlled by an integration control signal, and current mirroring circuitry. The current mirroring circuitry may be to, when the switch is closed, flow an integration current to or from an electrode of the integration capacitor whose magnitude mirrors a current flowing on the corresponding column line. The integration control signal may be to close the switch for a specified amount of time during each of the plurality of time periods.

7 Claims, 7 Drawing Sheets

(51) Int. Cl.
*H03M 1/12* (2006.01)
*G06F 7/544* (2006.01)

(52) U.S. Cl.
CPC ... *H03M 1/1245* (2013.01); *G06F 2207/4802* (2013.01); *G06F 2207/4824* (2013.01)

(56) References Cited

U.S. PATENT DOCUMENTS

| | | | |
|---|---|---|---|
| 2014/0172937 A1 | 6/2014 | Linderman et al. | |
| 2015/0170025 A1 | 6/2015 | Wu et al. | |
| 2015/0347896 A1* | 12/2015 | Roy | G06N 3/063 365/148 |
| 2017/0109628 A1* | 4/2017 | Gokmen | G06N 3/0472 |

FOREIGN PATENT DOCUMENTS

| | | | |
|---|---|---|---|
| CN | 105844330 A | 8/2016 | |
| CN | 106373611 A | 2/2017 | |
| TW | 279231 B | 6/1996 | |
| TW | I417798 B | 12/2013 | |
| WO | WO-2017131792 A1 * | 8/2017 | ............. H03M 3/50 |

OTHER PUBLICATIONS

Woods, W. et al.; "Memristor Panic—A Survey of Different Device Models in Crossbar Architectures"; Proceedings of the 2015 IEEE/ACM International Symposium on Nanoscale Architectures (NANOARCH 15), IEEE, Jul. 8, 2015, pp. 106-111. xp033188726, D.O.I. 10.1109/NANOARCH.2015.7180595.

Extended European Search Report, EP Application No. 18159707.1, dated Jul. 16, 2018, pp. 1-5, EPO.

Ali Shafiee et al., "ISAAC: A Convolutional Neural Network Accelerator with In-Situ Analog Arithmetic in Crossbars," Oct. 5, 2016, pp. 1-13, Available at: <cs.utah.edu/~rajeev/pubs/isca16.pdf>.

Jahromi, M.R. et al., "Memristor based Digital-to-Analog Converter and its Programming," May 2015, 1-page.

Ligang Gao et al., "Analog-Input Analog-Weight Dot-Product Operation with Ag/a-Si/Pt Memristive Devices," 2012, pp. 1-6, University of California Santa Barbara, Santa Barbara, CA, USA.

Ligang Gao et al., "Digital-to-Analog and Analog-to-Digital Conversion with Metal Oxide Memristors for Ultra-Low Power Computing," 2013, pp. 1-4, University of California Santa Barbara, CA, USA.

Mark D. Hale, "A Digital-to-Analog Converter Architecture for Multi-Channel Applications," May 2008, pp. 1-99, Doctoral Dissertation, University of Tennessee, Knoxville, Tennessee, USA.

* cited by examiner

ANALOG MULTIPLIER-ACCUMULATORS

BACKGROUND

A multiplier-accumulator (MAC) is a device that performs a multiply-accumulate operation. For example, the multiply-accumulate operation may include multiplying various values and adding the products together.

An artificial neuron may include circuitry that receives one or more input signals and performs operations on the inputs to generate an output signal. The input signals and output signals may be, for example voltages, currents, digital values, etc. In certain examples, the operations performed by an artificial neuron on the inputs may include multiply-accumulate operations, in which case the artificial neuron may include a MAC. In such examples, the input signals of the neuron may be fed to the MAC for multiplication with other values (e.g., weightings that are set for each input) and the output signal of the neuron may be based on the output signal of the MAC. Artificial neural networks are collections of artificial neurons in which the output signals of some neurons are used as the input signals of other neurons.

DETAILED DESCRIPTION

Figure 1:
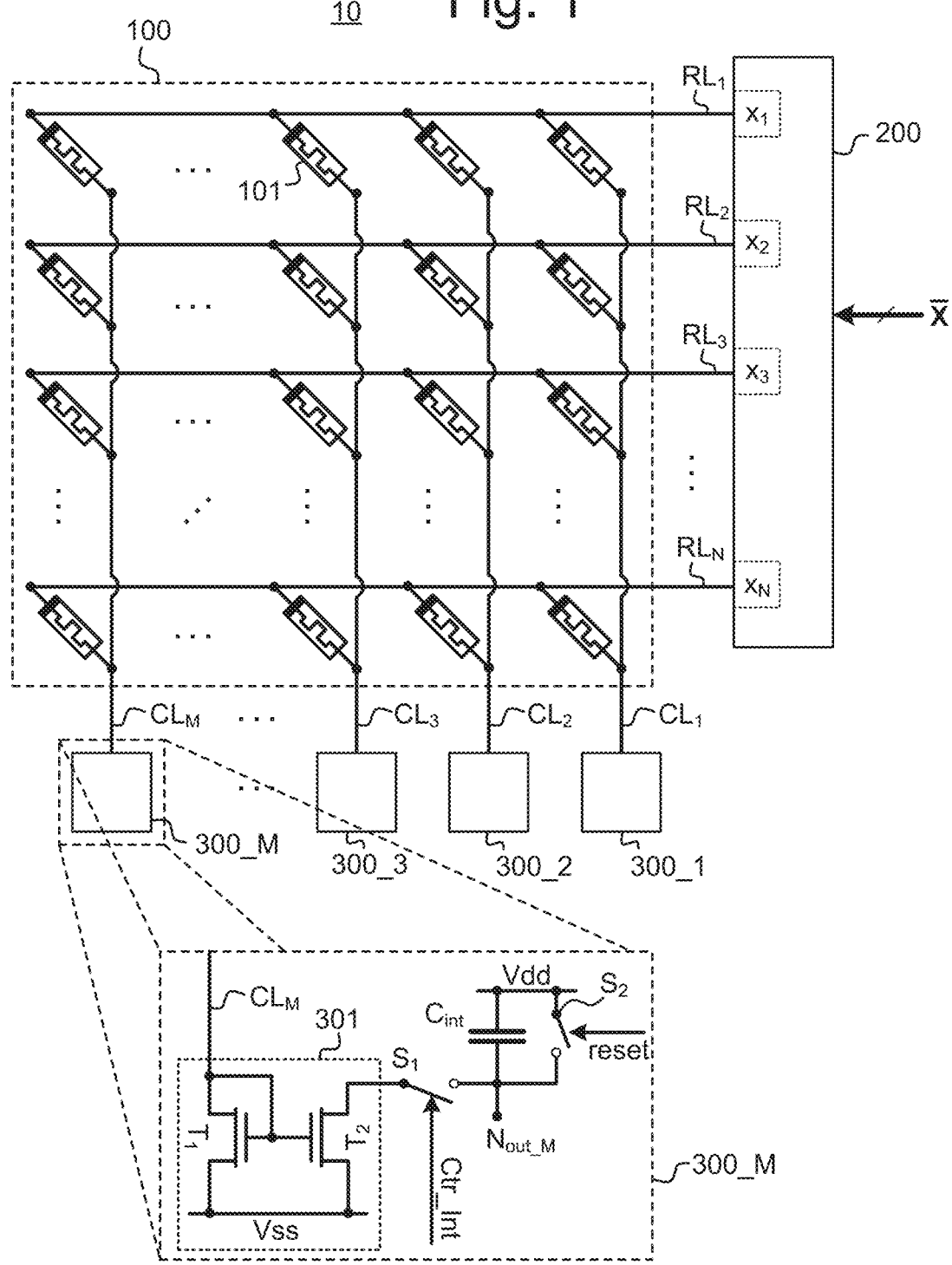
FIG. 1 is a circuit diagram illustrating an example electronic device that includes memristor-based analog MACs.

An example electronic device may include a number of memristor-based analog MACs. A memristor-based analog MAC is a MAC that performs the multiply-accumulate operation in the analog domain, using one or more memristors to perform a multiply portion of the multiply-accumulate operation. For example, voltages may be applied across the memristors and the resulting currents flowing through the memristors may be summed. The conversion of voltage to current represents the multiply portion of the multiply-accumulate operation in the analog domain, since the current flowing through each memristor equals the conductance of the memristor multiplied by the voltage applied across the memristor. Thus, the desired multiplications may be made in the analog domain by appropriately setting the conductances of the memristors and the voltages applied thereto.

Certain example electronic devices described herein may include multiple such memristor-based analog MACs. For example, the example electronic devices may include a memristor crossbar array, which may include column lines, row lines, and memristors arranged in an array with each of the memristors connected between one of the column lines and one of the row lines. A column output circuit may be included for each column line, with each column of memristors and its corresponding column output circuit forming a MAC. In such examples, voltages may be applied to the rows of the crossbar array based on an input vector, and an output vector may be determined based on the currents flowing through the memristors as a result of the applied voltages. An input stage may be used to generate the appropriate voltages for each row based on the input vector. For example, the crossbar array may form one layer of neurons in an artificial neural network ("ANN"), with each of the MACs forming an artificial neuron and weights for the neurons being set by adjusting the conductances of the corresponding memristors.

In certain examples, an input stage of the crossbar array may apply analog voltages to the row lines based on a digital input vector—specifically, the digital input vector may include a digital value for each row line, and the analog voltages that are applied to the row lines may be based on the respective digital values of the row lines. In certain examples, the input stage may employ a distributed digital-to-analog conversion architecture in which a single voltage source is used to generate the voltages for all of the row lines across a number of time periods. In particular, in such a distributed digital-to-analog conversion architecture, a voltage source (such as the digital-to-analog converter 230 in FIG. 2) may generate a signal that steps through a series of voltages $V_1, V_2, \ldots V_P$ in time periods $t_1, t_2, \ldots, t_P$, respectively, and switching units (such as the switching units 210) may be provided for each row to connect that row to the voltage signal when the signal is at the appropriate voltage for that row according to the input digital value for that row. For example, each row (if any) with a digital input value of "1" may be connected to the voltage source during time period $t_1$ (and thus the voltage $V_1$ would be applied to those rows), each row (if any) with a digital input value of "2" may be connected to the voltage source during time period $t_2$ (and thus the voltage $V_2$ would be applied to those rows), and so on. In this manner, each row may have the appropriate analog voltage applied thereto based on the row's input digital value without having to include a digital-to-analog converter for each row line.

The column output circuitry for each column line may be configured to generate an output signal that corresponds to a sum of the currents that flow on the corresponding column line. However, when a distributed digital-to-analog conversion architecture is used, the voltages are not necessarily applied to the row lines simultaneously, and therefore the currents may flow through the various memristors at different timings. Thus, in order to obtain the output signal that corresponds to a sum of the currents flowing on the corresponding column line, in certain examples each column output circuit may include an integration capacitor, a switch that is controlled by an integration control signal, and current mirroring circuitry that is to, when the switch is closed, flow an integration current to or from an electrode of the integration capacitor whose magnitude mirrors a current flowing on the corresponding column line, and the integration control signal may close the switch for a specified amount of time during each of the plurality of time periods. As a result, by the end of the $P^{th}$ time period $t_P$, for each column output circuit a voltage difference stored in the integration capacitor will be proportional to the sum of all the currents that flowed on the column line from time periods $t_1$ to $t_P$, which is the desired MAC result scaled by a constant. Specifically, the voltage difference stored in the integration capacitor will be $$\frac{t_{int}}{C_{int}} \sum_n V_{x_n} G_{RL\_n},$$

where $V_{x_n}$ is the voltage applied to the $n^{th}$ row RL_n (which is based on the digital input $x_n$) and $G_{RL\_n}$ is the conductance of the memristor that is connected to the $n^{th}$ row RL_n.

By using the example column output circuits described above, certain examples are able to avoid having to provide sample-and-hold circuits for each row line. Specifically, one alternative approach to generating an output signal that corresponds to a sum of the currents that flow on the corresponding column line would be to cause all of the currents to flow at the same time and then sense the resulting aggregate current. However, when a distributed digital-to-analog conversion architecture is used, in order to ensure that all of the currents flow on the corresponding column line at the same time, some mechanism for holding the disparate voltages that are generated for the row lines across the time periods $t_1$ to $t_P$ (such as a sample-and-hold circuit for each row line) may be needed so that the respective voltages may be applied to the row lines simultaneously. Such sample-and-hold circuits may take up chip space and increase a cost of the device, and therefore examples described herein that are able to omit such per-row sample-and-hold circuits as a result of using the example column output circuits described above may have reduced costs and improved chip space usage.

FIG. 1 illustrates an example electronic device 10. The example electronic device 10 includes a memristor crossbar array 100, row driver circuitry 200, and a number of column output circuits 300 that each correspond to one of the column lines CL of the memristor crossbar array 100.

The memristor crossbar array 100 may include N row lines RL (where N≥1), M column lines CL (where M≥1), and a number of memristors 101 that each are connected between one of the row lines RL and one of the column lines CL. In certain examples, each intersection of a row line RL with a column line CL may have a corresponding memristor 101. Each of the row lines $RL_n$ may correspond to a digital input value $x_n$ of a digital input vector $\overline{X}=(x_1, x_2, \ldots, x_N)$. Specifically, row line $RL_1$ corresponds to digital input value $x_1$, row line $RL_2$ corresponds to digital input value $x_2$, and so on.

The memristor crossbar array 100 and column output circuits 300 may form a number of memristor-based analog MACs. For example, in FIG. 1 each column line CL corresponds to an individual MAC. Specifically, an individual MAC may comprise a column output circuit 300, the column line CL that is connected to the column output circuit 300, and the memristors 101 that are connected to the column line CL. An individual MAC may have N inputs, each corresponding to one of the row lines $RL_n$; specifically, an individual input of a given MAC may comprise the memristor 101 that is connected to the corresponding row line $RL_n$. Each input of a given MAC may be assigned a weighting by setting the conductance $G_{RL_n}$ of the corresponding memristor 101 to a value that corresponds to the desired weight. Although there may be many MACs included in the example device 10, portions of the description below may focus on a single MAC for ease of description, especially when describing features that are common to each of the MACs.

The row driver circuitry 200 serves as an input stage of the crossbar array 100, and may apply analog voltages to the row lines RL across a plurality of time periods based on the digital input vector $\overline{X}$ according to a distributed digital-to-analog conversion architecture. Specifically, in certain examples the row driver circuitry 200 may apply a plurality of analog voltages $V_1, V_2, \ldots V_P$ to a first node 220 during a plurality of time periods $t_1, t_2, \ldots, t_P$, respectively, and, for each of the row lines RL, selectively connect the row line $RL_n$ to the first node 220 during one of the plurality of time periods $t_1, t_2, \ldots, t_P$ based on the corresponding digital input value $x_n$ of the digital input vector $\overline{X}$. For example, any row lines $RL_n$ whose digital input value $x_n$ is equal to "1" may be connected to the first node 220 during the first time period $t_1$, any row lines $RL_n$ whose digital input value $x_n$ is equal to "2" may be connected to the first node 220 during the first time period $t_2$, and so on. An example of the row driver circuitry 200 is described in greater detail below in relation to FIG. 2.

The column output circuits 300 may each include an integration capacitor $C_{int}$, a switch $S_1$ that is controlled by an integration control signal Ctr_Int, and current mirroring circuitry 301 that is to, when the switch $S_1$ is closed, flow an integration current to or from an electrode of the integration capacitor $C_{int}$ whose magnitude mirrors a current flowing on the corresponding column line CL. When it is said that the current mirroring circuitry 301 is to flow an integration current "to or from" an electrode of the integration capacitor $C_{int}$ (or the like), this should be understood to mean that one possible configuration of the current mirroring circuitry 301 is to flow current to the integration capacitor $C_{int}$ while another possible configuration of the current mirroring circuitry 301 is to flow current away from the integration capacitor $C_{int}$. The integration capacitor $C_{int}$ may have a first electrode connected to the switch $S_1$ and a second electrode connected to a high voltage Vdd. An output node $N_{out}$ may be connected to the first electrode of the integration capacitor $C_{int}$ such that a voltage $V_C$ of the first electrode may be read out via output node $N_{out}$, thereby enabling the voltage difference $\Delta V_C$ stored in the integration capacitor to be ascertained. In certain examples, a reset switch $S_2$ may also be included between the high voltage Vdd and the first electrode, which may be controlled by a reset signal to reset the voltage difference $\Delta V_C$ stored in the integration capacitor $C_{int}$ to zero.

Details of one of the column output circuits 300 (namely, the column output circuit 300_M) are illustrated in FIG. 1 in an expanded view indicated by dashed lines. In certain examples, each of the column output circuits 300 may include similar features in similar configurations (except for being connected to different column lines CL), and therefore the example column output circuit 300_M that is illustrated in the expanded view may be representative of all of the column output circuits 300, and duplicative illustrations are omitted.

One possible example of the current mirroring circuitry 301 is illustrated in FIG. 1. The example current mirroring circuitry 301 includes a first transistor $T_1$ connected between the corresponding column line CL and a low voltage Vss (also referred to as a "first voltage") and a second transistor $T_2$ connected between the low voltage Vss and the switch $S_1$, with the gate electrodes of the first and second transistors $T_1$ and $T_2$ being connected together and to the corresponding column line CL. The example current mirroring circuitry 301 illustrated in FIG. 1 will, when the switch $S_1$ is closed, flow charge away from the integration capacitor $C_{int}$ at a rate that is based on the current flowing on the corresponding column line CL. It should be understood that this is merely one example of the current mirroring circuitry 301, and that any type of current mirror could be used as long as is configured to, when the switch $S_1$ is closed, flow an integration current to or from an electrode of the integration capacitor $C_{int}$ whose magnitude mirrors a current flowing on the corresponding column line CL.

The electronic device 10 may be configured to process the digital input vector $\overline{X}$ during a processing period that comprises at least the time periods $t_1, t_2, \ldots, t_P$. As noted above, the row driver circuitry 200 may apply a voltage to the first node 220 during each of the time periods $t_1, t_2, \ldots, t_P$. In addition, during each of the time periods $t_1, t_2, \ldots, t_P$, the integration control signal Crt_Int is to close the switch $S_1$ for a specified amount of time $t_{int}$. For example, if the switch $S_1$ is configured to be closed when Crt_Int is at a high logical value, then Crt_Int may be pulsed high during each of the time periods $t_1, t_2, \ldots, t_P$ with a width of the pulse being $t_{int}$, where $t_{int}$ is smaller than the duration of any of the time periods $t_1, t_2, \ldots, t_P$. The timings at which Crt_Int is pulsed may be set such that transient effects resulting from the changing of voltages that are applied to the row lines RL may have subsided before Crt_Int is pulsed. For example, since the voltages applied to the row lines RL change at the start of each time of the time periods $t_1, t_2, \ldots, t_P$, the integration control signal Crt_Int may be pulsed a period of time $\Delta t$ after the start of each of the time periods $t_1, t_2, \ldots, t_P$, where $\Delta t$ is set so as to avoid any transient effects. For example, if to is the duration of each of the time periods $t_1, t_2, \ldots, t_P$, then the integration control signal Crt_Int may be pulsed at timings that are $\Delta t \geq \frac{1}{2} t_A$ after the start of each of the time periods $t_1, t_2, \ldots, t_P$. In certain examples, $t_{int}$ may be less than $\frac{1}{2} \cdot t_A$.

Thus, at each time period $t_p$, a charge packet $Q_p$ is subtracted from (or, in some examples, added to) the first electrode of the capacitor $C_{int}$, where the magnitude of $Q_p$ depends on the current $I_p$ that is flowing on the corresponding column CL during $t_p$. Whether the charge packet $Q_p$ is subtracted from or added to the first electrode depends on the configuration of the current mirroring circuitry 301. For example, the example current mirroring circuitry 301 illustrated in FIG. 1 is to cause the charge packet $Q_p$ to be subtracted from the first electrode. The magnitude of the charge packet $Q_p$ may be given by:

$$Q_p = t_{int} \sum_{\substack{n:\\x_n=p}} I_{RL_n} = t_{int} V_p \sum_{\substack{n:\\x_n=p}} G_{RL_n} \qquad \text{(eq. 1)}$$

where $I_{RL\_n}$ is the current flowing through the memristor 101 that is connected to the row line RL_n and the corresponding column CL, $G_{RL\_n}$ is the conductance of that memristor 101, and the summation is over all values of n for which $x_n=p$ (i.e., over all row lines RL_n whose digital input value $x_n$ is equal to p). Note that the summation $$\sum_{\substack{n:\\x_n=p}} G_{RL_n}$$

has a zero for any time period $t_p$ in which there are no values of n for which $x_n=p$, and hence $Q_p$ has zero magnitude for such time periods.

Once the $P^{th}$ time period $t_P$ has ended, the total amount of charge that will have been subtracted from (or, in some examples, added to) the first electrode of the capacitor $C_{int}$ will be equal to:

$$\sum_p Q_p = t_{int} \sum_p \left( V_p \sum_{\substack{n:\\x_n=p}} G_{RL_n} \right) = t_{int} \sum_n V_{x_n} G_{RL_n} \qquad \text{(eq. 2)}$$

Recall that $V_{x_n}$ is the voltage that is applied to the $n^{th}$ row.

Combining equation 2 with the characteristic equation for a capacitor V=Q/C implies that the magnitude of the voltage difference $\Delta V_C$ that is stored in the integration capacitor $C_{int}$ once the $P^{th}$ time period $t_P$ has ended will be given by:

$$\Delta V_C = Vdd - V_C = \frac{t_{int}}{C_{int}} \sum_n V_{x_n} G_{RL_n} \qquad \text{(eq. 3)}$$

Note that the polarity of the voltage difference $\Delta V_C$ will depend on whether the current mirroring circuitry 300 is configured to flow current to the integration capacitor $C_{int}$ or to flow current away from the integration capacitor $C_{int}$, but the magnitude of the voltage difference $\Delta V_C$ should be the same regardless. Thus, the voltage difference $\Delta V_C$ equals the desired MAC result (i.e., $\Sigma_n V_{x_n} G_{RL_n}$) scaled by a constant $(t_{int}/C_{int})$.

Figure 3:
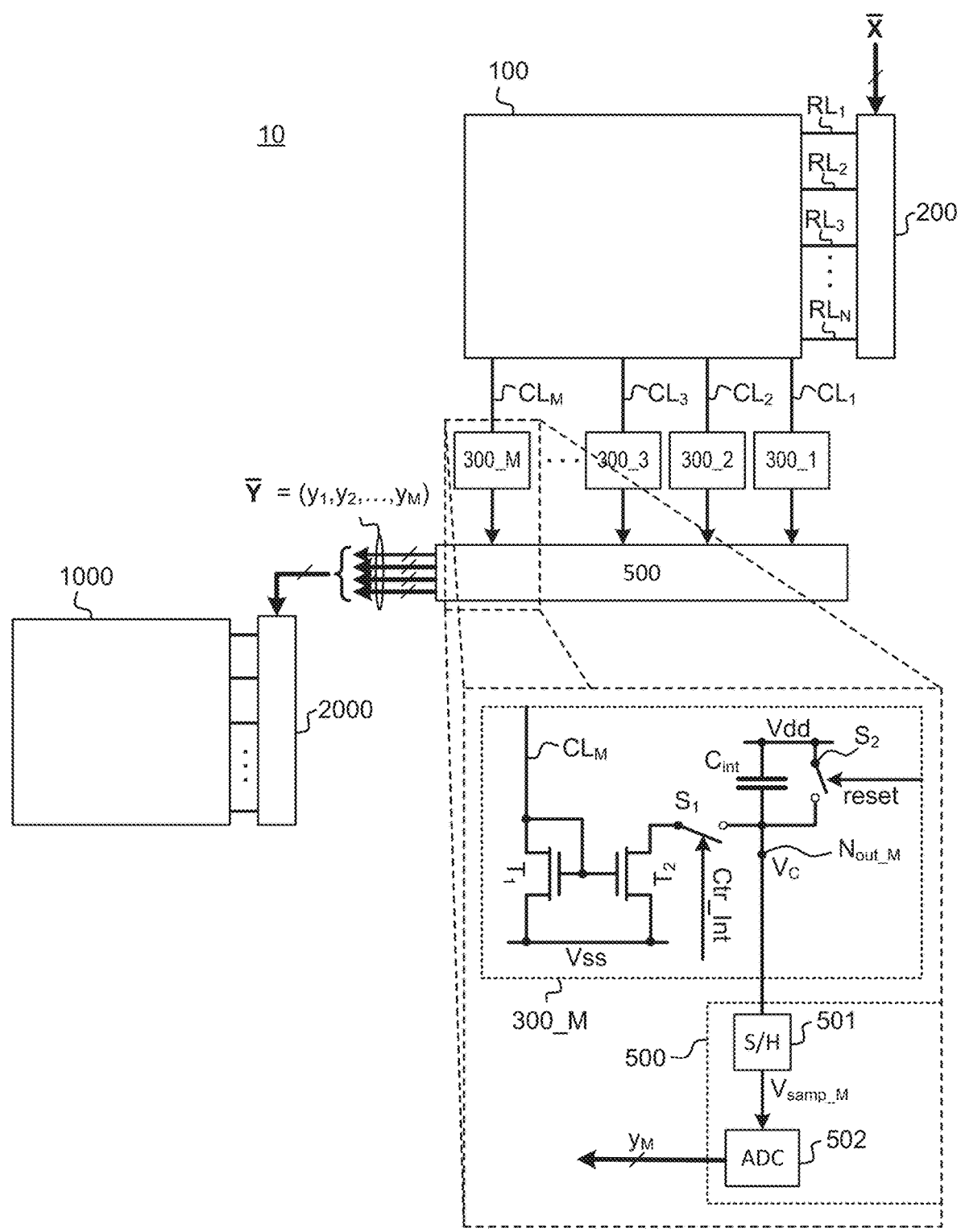
FIG. 3 is block diagram illustrating an example electronic device that includes multiple neural network layers and output circuitry for generating a digital output vector.

For each column output circuit 300, the voltage difference $\Delta V_C$ may be determined from the voltage $V_C$ output via the output node $N_{out}$, and an output value $y_m$ for the corresponding column line CL may be generated based on $\Delta V_C$. The outputting of the voltage $V_C$ may include, for example, selectively connecting the node $N_{out}$ to a subsequent processing stage (e.g., via a switch (not illustrated)) and/or sampling the voltage $V_C$ of the node $N_{out}$. For example, the voltage $V_C$ of the output node $N_{out}$ may be output to an analog buffer or an ADC from which the output value $y_m$ may be generated. As another example, the voltage $V_C$ of the output node $N_{out}$ may be sampled and the output value $y_m$ may be generated based on the sampled voltage $(V_{samp})$. The output values $y_1$ through $y_M$ from all of the column lines $CL_1$ through $CL_M$ may form an output vector $\overline{Y}=(y_1, y_2, \ldots y_M)$. FIG. 3 (described in greater detail below) illustrates an example in which the output values $y_1$ through $y_M$ are digital values, while FIG. 4 (described in greater detail below) illustrates an example in which the output values $y'_1$ through $y'_M$ are analog values.

In the example device 10, the timings at which voltages are applied to row lines RL may vary according to the digital input vector $\overline{X}$. For example, for a given input phase, during some of the time periods $t_1, t_2, \ldots, t_P$ none of the row lines RL may have a voltage applied thereto, during others of the time periods $t_1, t_2, \ldots, t_P$, a single row line RL may have a voltage applied thereto, and during others of the time periods $t_1, t_2, \ldots, t_P$, multiple row lines RL may have a voltage applied thereto simultaneously. However, regardless of the various timings at which the various voltages may be applied, the column output circuitry 300 may be able to generate the desired MAC result.

For example, suppose there are N=4 row lines RL and that the digital input vector $\overline{X}=(1, 4, 2, 1)$ is input to the device 10. In this example, during the first time period $t_1$, both the first row $RL_1$ and the fourth row $RL_4$ will have the voltage $V_1$ applied thereto, since the digital input values $x_1$ and $x_4$ for the rows $RL_1$ and $RL_4$ are both equal to "1". Thus, during time period $t_1$ a charge packet $Q_1$ with magnitude $t_{int}V_1$ $(G_{RL\_1}+G_{RL\_4})$ will be subtracted from (or, in some examples, added to) the integration capacitor $C_{int}$. During the second time period $t_2$, the third row $RL_3$ will have the voltage $V_2$ applied thereto, since the digital input value $x_3$ for the row $RL_3$ is equal to "2". Thus, during time period $t_2$ a charge packet $Q_2$ with magnitude $t_{int}V_2G_{RL\_3}$ will be subtracted from (or, in some examples, added to) the integration capacitor $C_{int}$. During the third time period $t_3$, no row lines RL will have the voltage $V_3$ applied thereto, since none of the digital input values $x_n$ are equal to "3". Thus, during time period $t_3$ the charge on the electrode of the integration capacitor $C_{int}$ is unchanged. During the fourth time period $t_5$, the second row $RL_2$ will have the voltage $V_4$ applied thereto, since the digital input value $x_2$ for the row $RL_2$ is equal to "4". Thus, during time period $t_4$ a charge packet $Q_4$ with magnitude $t_{int}V_4G_{RL\_2}$ will be subtracted from (or, in some examples, added to) the integration capacitor $C_{int}$. If there are any additional time periods after $t_4$, then no voltages are applied to the row lines during those time periods, since none of the digital input values are greater than "4". Thus, when the $P^{th}$ time period $t_P$ has ended, the voltage difference $\Delta V_C$ of the integration capacitor $C_{int}$ will be $(t_{int}/C_{int})$ $(V_1G_{RL\_1}+V_4G_{RL\_2}+V_2G_{RL\_3}+V_1G_{RL\_4})$, which is the desired MAC result scaled by the constant $(t_{int}/C_{int})$.

In FIG. 1, the crossbar array 100 is illustrated as having four or more row lines RL and four or more column lines CL, but this is merely one example used for convenience of description and any numbers of row lines RL and column lines CL greater than or equal to one may be included. Moreover, in certain examples, in addition to the row lines RL described above, additional row lines (not illustrated) may be provided in the crossbar array 100 that do not correspond to a digital input value $x_n$ of the digital input vector $\overline{X}$. For example, an offset line may be included that may be used for providing adjustable offsets for each MAC, but which does not have a corresponding digital input value $x_n$. Additional examples of possible row lines that do not have a corresponding digital input value $x_n$ may include dummy lines, calibration lines, error correction lines, and the like. Herein and in the appended claims, any references to "row lines" mean those row lines that correspond to a digital input value $x_n$ of the digital input vector $\overline{X}$ and not any other row lines that might be included in the crossbar array 100, unless specifically indicated otherwise. Thus, for example, a phrase such as "each of the row lines" should be understood to refer to each row line that corresponds to a digital input value $x_n$ of the digital input vector $\overline{X}$ and not to other possible row lines (such as an offset line), unless specifically indicated otherwise.

In FIG. 1, the voltages Vss and Vdd are illustrated, where Vdd>Vss. It should be understood that, in certain examples, the voltages Vss and Vdd could be reversed, such that Vdd is applied wherever Vss is illustrated as being applied and vice-versa. Such a reversal may also entail changing the polarities of various signals, changing directions in which various currents flow, changing the polarities of various transistors, and the like.

Figure 2:
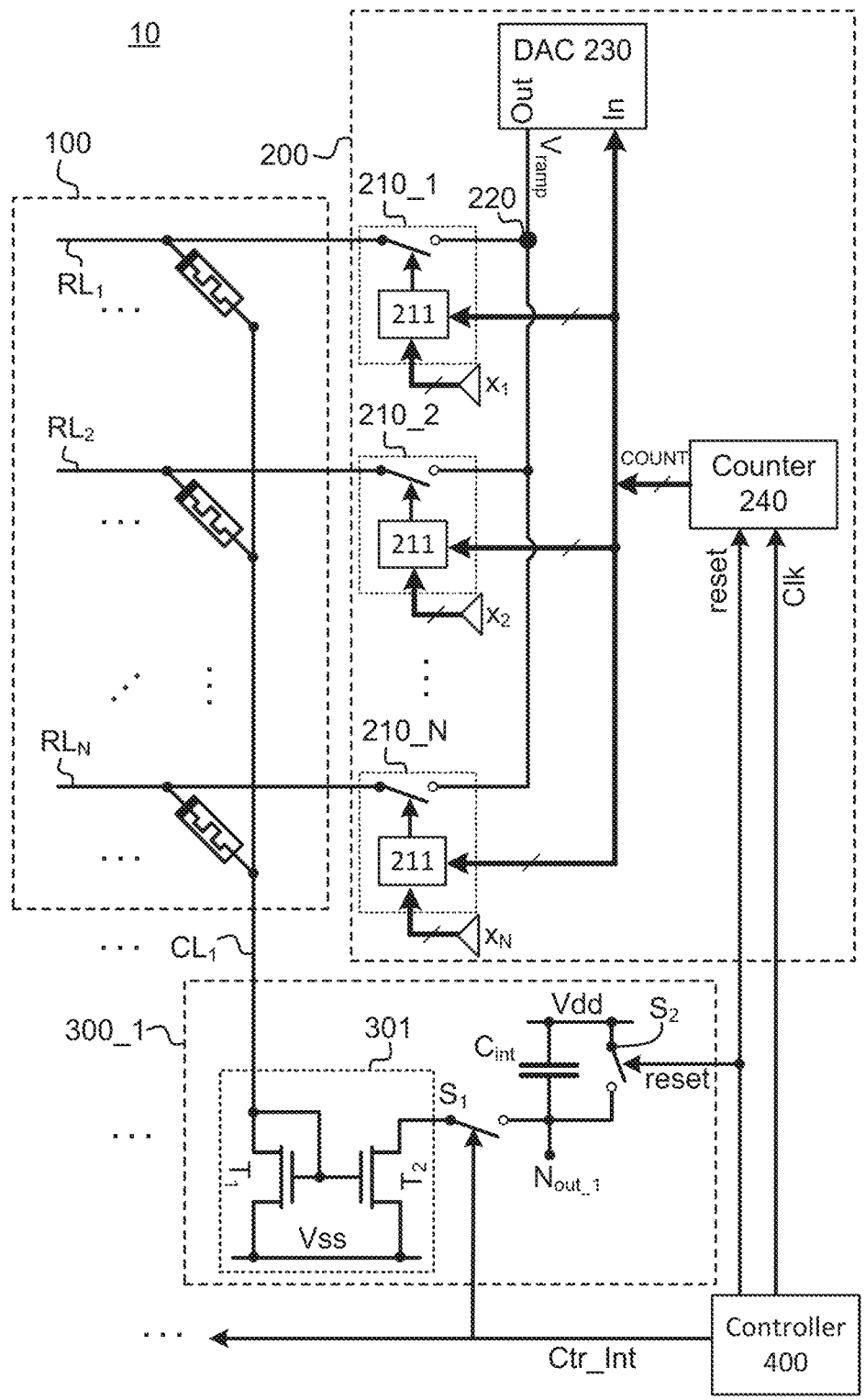
FIG. 2 is a circuit diagram illustrating example row driver circuitry.

FIG. 2 illustrates portions of an example electronic device 10 in greater detail. In particular, FIG. 2 illustrates an example of the row driver circuitry 200, as well as a controller 400. Various elements of FIG. 2 correspond to elements of FIG. 1 that were already described above, and the same reference numbers are used in both Figures for such corresponding elements. Duplicative description of such corresponding features is omitted.

The example row driver circuitry 200 includes a switching circuit 210 for each of the row lines RL, the first node 220, a digital-to-analog converter ("DAC") 230, and a counter 240.

Each of the switching circuits 210 may store a digital value from the digital input vector $\overline{X}$ and connect the first node 220 to the corresponding row line RL during the one of the time periods $t_1$-$t_P$ that corresponds to the stored digital value. In other words, if the digital value $x_n$=p is stored in the switching circuit 210_$n$, then the switching circuit 210_$n$ is to connect the node 220 to the corresponding row line $RL_n$ during time period $t_P$. Thus, for example, if there were N=4 row lines RL and the digital input vector $\overline{X}$=(1, 4, 2, 1) were input to the row driver circuitry 200, then the switching circuit 210_1 and the switching circuit 210_4 would connect the rows $RL_1$ and $RL_4$ to the node 220 during $t_1$, the switching circuit 210_3 would connect the row $RL_3$ to the node 220 during $t_2$, and the switching circuit 210_2 would connect the row $RL_2$ to the node 220 during $t_4$. For example, each of the switching circuits 210 may include a switch connected between the row line RL and the node 220 and a comparison circuit 211 that is to close the switch at the appropriate timing. For example, the comparison circuit 211 may store the digital input value of the corresponding row line RL and may compare the stored digital value to the digital value COUNT output by the counter 240, and may close the switch when the stored digital value matches COUNT. For example, the comparison circuit 211 may include a register to store the digital input value and a comparator to compare the stored value with COUNT, an output of the comparator controlling the switch.

The DAC 230 may be to apply the voltages $V_1$ to $V_P$ to the node 220 during the time periods $t_1$ to $t_P$, respectively. For example, the DAC 230 may generate an analog voltage signal $V_{ramp}$ based on a digital value COUNT whose value may change at the start of each time period $t_1$ to $t_P$ according to the clock signal Clk. Accordingly, the signal $V_{ramp}$ may step through the voltages $V_1$ to $V_P$ during the time periods $t_1$ to $t_P$, where $V_1$ is an analog voltage corresponding to the value of COUNT during $t_1$, $V_2$ is an analog voltage corresponding to the value of COUNT during $t_2$, and so on.

As noted above, the counter 240 may output a digital signal COUNT, whose value may change at the start of each of the time periods $t_1$-$t_P$ according to the clock Clk. In certain examples, the counter 240 may be configured to increment a value of COUNT each time period, in which case the signal $V_{ramp}$ may take the form of a ramp signal whose magnitude increases during each time period.

Figure 7:
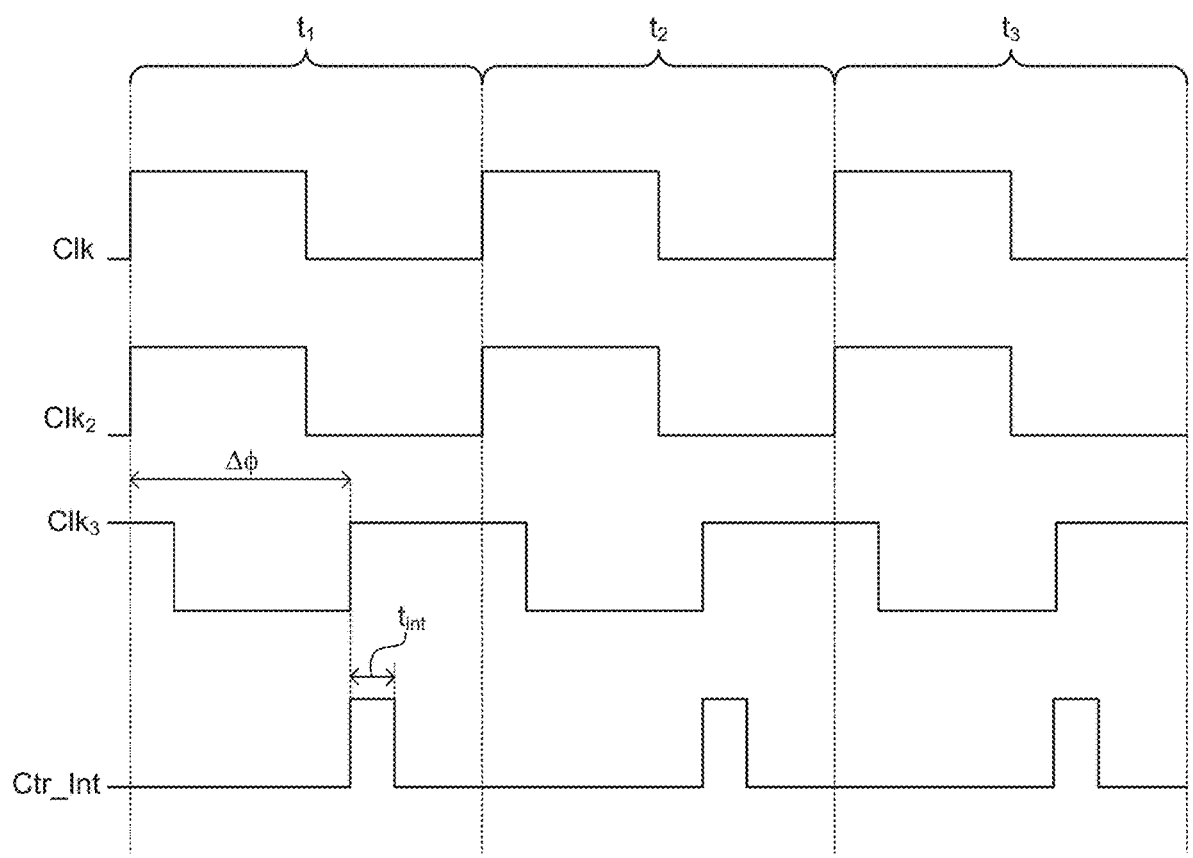
FIG. 7 is a signal timing diagram illustrating a clock signal, an integration control signal, and various intermediate clock signals that may be used to generate the integration control signal from the clock signal.

The controller 400 may include circuitry to generate the clock signal Clk, the reset signal, and the integration control signal Crt_Int. The clock signal Clk may be any clock signal. The controller 400 may assert the reset signal after the $P^{th}$ time period $t_P$ to reset the counter 240 and the integration capacitor $C_{int}$ of each of the column output circuits 300. The controller 400 may release the reset signal when a new processing period is begun for a new digital input value $\overline{X}$. The integration control signal Crt_Int may be generated based on the clock signal Clk. For example, as illustrated in FIG. 7, a second clock signal $Clk_2$ with a same period as the clock signal Clk may be generated, a third signal $Clk_3$ may be generated from the second signal $Clk_2$ by shifting a phase of the second signal $Clk_2$ by an amount $\Delta\phi$, and then the integration control signal Crt_Int may be generated from the third signal $Clk_3$ by truncating each active pulse of the third signal $Clk_3$ such that the period of the active pulses remains the same but their pulse width is made equal to $t_{int}$. The active pulses of the third signal $Clk_3$ may correspond to whichever logical value causes the switches $S_1$ to be closed. In FIG. 7 it is assumed that a logical high value of the integration control signal Crt_Int closes the switches $S_1$, and therefore the high pulses of the third signal $Clk_3$ are the active pulses that are truncated to form the integration control signal Crt_Int.

Figure 4:
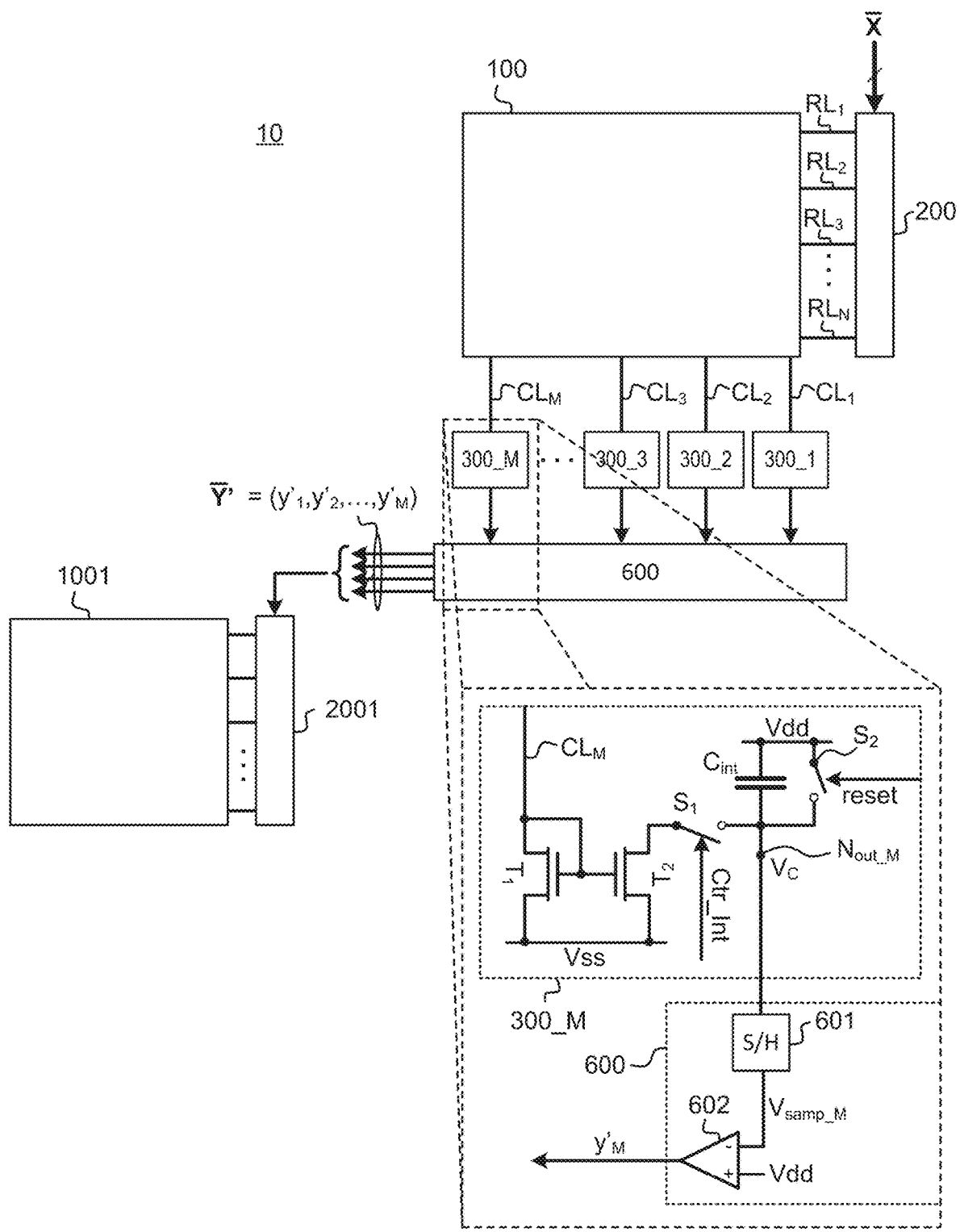
FIG. 4 is block diagram illustrating an example electronic device that includes multiple neural network layers and output circuitry for generating an analog output vector.

In certain examples, the electronic device 10 may include an artificial neural network ("ANN"). For example, the crossbar array 100, the row driver circuitry 200, and the column output circuits 300, may correspond to a first layer of the ANN. In such an example, each MAC of the crossbar array 100 may correspond to an induvial neuron. Specifically, each column may correspond to an individual neuron, and the neuron may include each of the memristors 101 in the corresponding column together with the column output circuit 300 of the corresponding column. In certain examples, each column of the crossbar array 100 corresponds to exactly one neuron (e.g., there is a one-to-one correspondence between columns and neurons), while in other examples (e.g., see FIG. 5) more than one column may correspond to multiple neurons (e.g., there is a many-to-one correspondence between columns and neurons). There may be additional layers of the ANN subsequent to the first layer, in which case the output $\overline{Y}=(y_1, y_2, \ldots, y_M)$ of the first layer may be fed to the second layer as an input thereof. FIGS. 3 and 4 (described in greater detail below) illustrate examples in which the electronic device 10 includes multiple layers of an ANN.

FIG. 3 illustrates an example in which the electronic device 10 includes an ANN and in which the output values $y_1$-$y_M$ of the first layer are digital output values. Various elements of FIG. 3 correspond to elements of FIG. 1 that were already described above, and the same reference numbers are used in both Figures for such corresponding elements. Duplicative description of such corresponding features is omitted. Details of the column output circuit 300_M and the output circuit 500 are illustrated in an expanded view indicated by dashed lines.

In the example of FIG. 3, a first layer of the ANN is formed by the crossbar array 100, the row driver circuitry 200, and the column output circuits 300. The example electronic device 10 also includes an output circuit 500 that generates the digital output values $y_1$-$y_M$ (collectively the digital output vector Y) based on the voltage differences $\Delta V_C$ of the column output circuits 300_1 to 300_M, respectively, and feeds the digital output values $y_1$-$y_M$ to an input stage 2000 of a second layer 1000 of the ANN.

For example, the output node $N_{out}$ of each of the column output circuits 300 may be connected to the output circuit 500, such that the respective voltages $V_C$ of the column output circuits 300 may be output to the output circuit 500. The output circuit 500 may include an analog-to-digital converter ("ADC") 502 that is to generate a digital output value $y_m$ that corresponds to the voltage difference $\Delta V_C$ of the $m^{th}$ column output circuit 300 based on the voltage $V_C$ that is output via the output node $N_{out\_m}$ (or based on another analog voltage that itself is based on $V_C$, such as a sampled voltage $V_{samp}$) with the voltage Vdd serving as a reference voltage. In certain examples, a separate ADC 502 may be provided for each of the column output circuits 300. In other examples, the multiple column output circuits 300 (perhaps all of the column output circuits 300) may share the same ADC 502. In FIG. 3, the output circuit 500 is illustrated as also including sample-and-hold circuits ("S/H") 501 that are to sample the voltage $V_C$ and provide a sampled voltage $V_{samp}$ to the ADC 502. For example, a separate S/H 501 may be provided for each column output circuit 300. However, in certain examples the S/H 501 circuits may be omitted and the voltages $V_C$ may be fed directly to the ADC 502.

In certain examples, the second layer 1000 of the ANN and its associated input stage 2000 may be configured to receive digital input vectors and output digital output vectors, similar to the first layer of the example device 10 in FIG. 3. In some such examples, the second layer 1000 of the ANN and its associated input stage 2000 may have a similar configuration as that of the first layer. Specifically, the second layer 1000 may include a crossbar array that is similar to the crossbar array 100 and column output circuits that are similar to the column output circuits 300, and the input stage 2000 may be similar to the row driver circuitry 200. In some such examples, additional layers of the ANN may be included (not illustrated), which may also be configured in a similar manner as the first layer. Such an approach may be beneficial in the sense that a uniform architecture is used for each layer.

FIG. 4 illustrates an example in which the electronic device 10 includes an ANN and in which the output values $y_1$-$y_M$ of the first layer are analog output values. Various elements of FIG. 4 correspond to elements of FIG. 1 that were already described above, and the same reference numbers are used in both Figures for such corresponding elements. Duplicative description of such corresponding features is omitted. Details of the column output circuit 300_M and the output circuit 600 are illustrated in an expanded view indicated by dashed lines. Hereinafter, an apostrophe may be appended to the reference signs of the analog output values $y_1$-$y_M$ and the output vector Y when referring specifically to the analog versions thereof to distinguish them from the digital versions thereof.

In the example of FIG. 4, a first layer of the ANN is formed by the crossbar array 100, the row driver circuitry 200, and the column output circuits 300. The example electronic device 10 also includes an output circuit 600 that generates the analog output values $y'_1$-$y'_M$ (collectively the analog output vector $\overline{Y}'$) based on the voltage differences $\Delta V_C$ of the column output circuits 300_1 to 300_M, respectively, and feeds the analog output values $y'_1$-$y'_M$ to an input stage 2001 of a second layer 1001 of the ANN.

For example, the output node $N_{out}$ of each of the column output circuits 300 may be connected to the output circuit 600, such that the respective voltages $V_C$ of the column output circuits 300 may be output to the output circuit 600. The output circuit 600 may include a buffer 602 for each column output circuit 300 that generates the corresponding analog output value $y'_m$ based on the voltage difference $\Delta V_C$ of the column output circuit 300 (or based on another analog voltage that itself is based on $\Delta V_C$). For example, the buffer 602 may include a differential amplifier that amplifies a difference between the voltage $V_C$ (or a corresponding voltage) and the high voltage Vdd to a level that is suitable for transfer to the second layer via an analog signal bus. As another example, the buffer 602 may include circuitry for converting the voltage difference $\Delta V_C$ to a current for transfer to the second layer via a current-based analog signal bus. In FIG. 3, the output circuit 500 is illustrated as also including sample-and-hold circuits ("S/H") 601 that sample the voltage $V_C$ and provide a sampled voltage $V_{samp}$ to the corresponding buffer 602. For example, a separate S/H 601 may be provided for each column output circuit 300. However, in certain examples the S/H 601 circuits may be omitted and the voltages $V_C$ may be fed directly to the buffer 602.

In certain examples, the second layer 1001 of the ANN and its associated input stage 2001 may be configured to receive an analog input vector and generate an analog output vector. Thus, in such examples, the second layer 1001 of the ANN and its associated input stage 2001 may have a different configuration from that of the first layer. Specifically, in such examples the second layer 1001 may include a crossbar array that is similar to the crossbar array 100, but column output circuits thereof may be different from the column output circuits 300 and the input stage 2001 may be different from the row driver circuitry 200. For example, the input stage 2001 may be configured to apply the analog output values $y_1$-$y_P$ directly to row lines of the second layer 1001 simultaneously, and the column output circuits of the second layer 1001 may be configured to sense an aggregate current flowing on each column line as a result of the applied voltages. In some such examples, additional layers of the ANN may be included (not illustrated), which may also be configured in a similar manner as the second layer 1001. Such an approach may be beneficial in that analog-to-digital conversion circuitry may be omitted from each layer, which may reduce cost and save chip space.

As noted above, weights may be independently set for each input (i.e., for each row line RL) of each of the individual MACs by setting the conductances of the corresponding memristors 101. In the examples of the electronic device 10 that were described above in relation to FIGS. 1-4, the weights for the inputs of a given MAC may all be positive or they may all be negative, but positive weights and negative weights cannot be set for different inputs of the same individual MAC. However, in certain examples it may be desirable for positive weights to be assigned to some inputs of a given MAC while negative weights are assigned to other inputs of the same MAC. Accordingly, FIG. 5 illustrates another example of the electronic device 10 in which both positive and negative weights may be assigned to the inputs of the same individual MAC.

Figure 5:
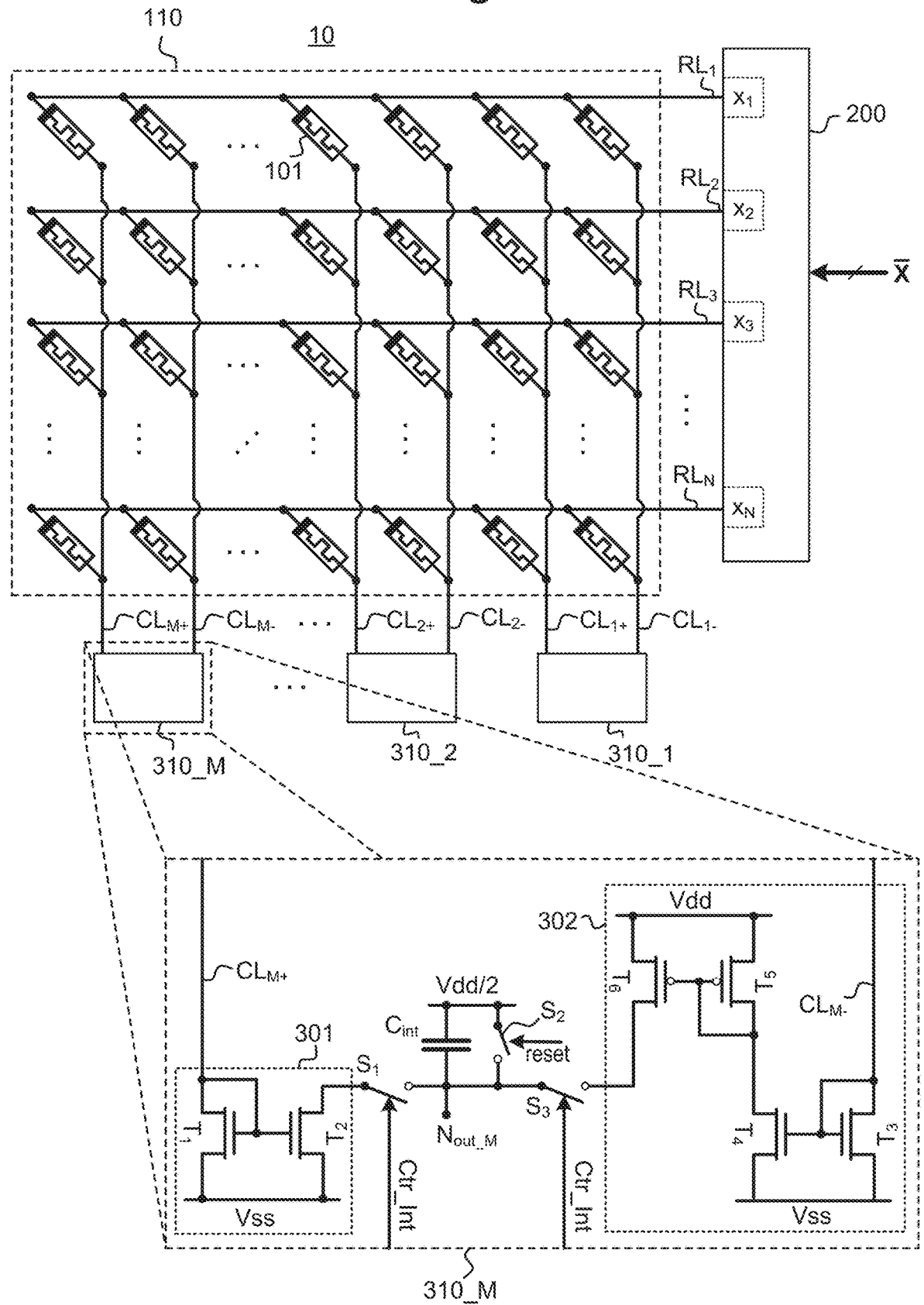
FIG. 5 is a circuit diagram illustrating an example electronic device that includes memristor-based analog MACs that each has a positive-weight column and a negative-weight column.

FIG. 5 illustrates an example device 10 that includes a crossbar array 110, row driver circuitry 200, and column output circuits 310. Various elements of FIG. 5 correspond to elements of FIG. 1 that were already described above, and the same references numbers are used in both Figures for such corresponding elements. Duplicative description of such corresponding features is omitted.

The crossbar array 110 of FIG. 5 is similar to the crossbar array 100 described above, with the exception that the column lines CL of the crossbar array 110 include positive-weight column lines CL+ and negative-weight column lines CL−. The positive-weight column lines CL+ and the negative-weight column lines CL− are arranged in pairs, such that for each positive-weight column line CL+ there is a corresponding negative-weight column line CL−. A memristor 101 that is connected to one of the positive-weight column lines CL+ may occasionally be referred to as a positive memristor 101, while a memristor 101 that is connected to one of the negative-weight column lines CL− may occasionally be referred to as a negative memristor 101. The positive memristors 101 may be used to assign positive weights while the negative memristors 101 may be used to assign negative weights, as described in greater detail below.

Each of the column output circuits 310 corresponds to a pair of column lines comprising one of the positive-weight column lines CL+ and its corresponding negative-weight column line CL−. Moreover, an individual MAC may comprise a column output circuit 310, the positive-weight column line CL+ and its corresponding negative-weight column line CL− that are connected to the column output circuit 310, and the memristors 101 that are connected to the pair of column lines CL+/CL−. An individual MAC may have N inputs, each corresponding to one of the row lines $RL_n$. Specifically, an individual input of a given MAC may comprise the positive memristor 101 and the negative memristor 101 that are connected to the corresponding row line $RL_n$.

The column output circuits 310 of FIG. 5 are similar to the column output circuits 300 described above, with the exception that second mirroring circuitry 302 is provided in addition to the first mirroring circuitry 301, and the integration capacitor $C_{int}$ is connected to an intermediate voltage Vdd/2 rather than to the high voltage Vdd. In particular, the first mirroring circuitry 301 may be connected to the corresponding positive-weight column line CL+, while the second mirroring circuitry 302 may be connected to the corresponding negative-weight column line CL−. The second current mirroring circuitry 302 may be selectively connected to the integration capacitor $C_{int}$ via a corresponding switch $S_3$ that is controlled by the integration control signal Ctr_Int. In certain examples, the switch $S_3$ that selectively connects the second current mirroring circuitry 302 to the integration capacitor $C_{int}$ may be the same device as the switch $S_1$ that connects the first current mirroring circuitry 301 to the integration capacitor $C_{int}$. In other examples, the switch $S_3$ that selectively connects the second current mirroring circuitry 302 to the integration capacitor $C_{int}$ may be a separate device from the switch $S_1$, as illustrated in FIG. 5. Hereinafter, the switch $S_3$ may be referred to as if it were separate from the switch $S_1$ for convenience, but it should be understood that the descriptions below may also apply to examples in which the switch $S_3$ and the switch $S_1$ are formed by the same device.

The first current mirroring circuitry 301 may be used to, when the switch $S_1$ is closed, flow a first integration current to or from an electrode of the integration capacitor $C_{int}$ whose magnitude mirrors a current flowing on the corresponding positive-weight column line CL+. The second current mirroring circuitry 302 may be used to, when the switch $S_3$ is closed, flow a second integration current from or to the electrode of the integration capacitor $C_{int}$ whose magnitude mirrors a current flowing on the corresponding negative-weight column line CL−. In particular, the first and second current mirroring circuitry 301/302 are such that the first integration current and the second integration current flow in opposite directions relative to the electrode of the integration capacitor $C_{int}$. In other words, if the first current mirroring circuitry 301 is used to flow current to the electrode, then the second current mirroring circuitry 302 is used to flow current away from the electrode, and vice-versa. Both the switch $S_1$ and the switch $S_3$ are controlled by the integration control signal Ctr_Int.

Possible examples of the first current mirroring circuitry 301 and the second current mirroring circuitry 302 are illustrated in the expanded view portion of FIG. 5. The example first current mirroring circuitry 301 shown in FIG. 5 is used to flow current away from the first electrode of the integration capacitor $C_{int}$, while the example second current mirroring circuitry 302 shown in FIG. 5 is used to flow current to the first electrode. The example second current mirroring circuitry 302 includes a third transistor $T_3$ connected between the corresponding negative-weight column line CL− and the low voltage Vss and a fourth transistor $T_4$ connected between the low voltage Vss and a fifth transistor $T_5$, with the gate electrodes of the third and fourth transistors $T_3$ and $T_4$ being connected together and to the corresponding column line CL−. The example second current mirroring circuitry 302 also includes a fifth transistor $T_5$ connected between the fourth transistor $T_4$ and the high voltage Vdd, and a sixth transistor $T_6$ connected between the high voltage Vdd and the switch $S_3$, with the gate electrodes of the fifth and six transistors $T_5$ and $T_6$ being connected together and to the fourth transistor $T_4$. The fifth and six transistors $T_5$ and $T_5$ may be p-channeled transistors, while the first through fourth transistors $T_1$-$T_4$ may be n-channeled transistors. The example second current mirroring circuitry 302 illustrated in FIG. 5 will, when the switch $S_3$ is closed, flow charge to the integration capacitor $C_{int}$ at a rate that is based on the current flowing on the corresponding negative-weight column line CL−. It should be understood that this is merely one example of the second current mirroring circuitry 302, and that any type of current mirror could be used as long as it is configured to, when the switch $S_3$ is closed, flow a second integration current to or from an electrode of the integration capacitor $C_{int}$ (in an opposite direction of the first integration current) whose magnitude mirrors a current flowing on the corresponding negative-weight column line CL−.

Specifically, at each time period $t_p$, charge packets are added to or subtracted from the first electrode of the capacitor $C_{int}$, where the net amount of charge that is added/subtracted during $t_P$ (hereinafter $Q'_p$) depends on the current $I_p^+$ that is flowing on the corresponding positive-weight column CL+ during $t_p$ and on the current $I_p^-$ that is flowing on the corresponding negative-weight column CL− during $t_p$. Specifically, $Q'_p$ may be given by:

$$Q'_p = t_{int}\left(\sum_{\substack{n:\\x_n=p}} I^+_{RL_n} - \sum_{\substack{n:\\x_n=p}} I^-_{RL_n}\right) = t_{int} V_p \sum_{\substack{n:\\x_n=p}} (G^+_{RL_n} - G^-_{RL_n}) \quad \text{(eq. 4)}$$

where $I^+_{RL\_n}$ is the current flowing through the positive memristor 101 that is connected to the row line RL_n and $G^+_{RL\_n}$ is the conductance of that memristor 101, $I^-_{RL\_n}$ is the current flowing through the negative memristor 101 that is connected to the row line RL_n and $G^-_{RL\_n}$ is the conductance of that memristor 101, and the summations are over all values of n for which $x_n$=p (i.e., over all row lines RL_n whose digital input value $x_n$ is equal to p). If $Q'_p$ is positive, then this means that the amount of charge that was subtracted from the first electrode by the first current mirroring circuitry 301 during $t_P$ exceeded the amount of charge that was added to the first electrode by the second current mirroring circuitry 302 during $t_p$ by the amount $Q'_p$. Conversely, if $Q'_p$ is negative, then this means that the amount of charge that was added to the first electrode by the second current mirroring circuitry 302 during $t_p$ exceeded the amount of charge that was subtracted from the first electrode by the first current mirroring circuitry 301 during $t_p$ by the amount $Q'_p$.

Thus, once the $P^{th}$ time period $t_p$ has ended, the total amount of charge that will have been added to or subtracted from the first electrode of the capacitor $C_{int}$ will be equal to:

$$\sum_p Q'_p = \quad \text{(eq. 5)}$$
$$t_{int}\sum_p \left(V_p \sum_{\substack{n:\\x_n=p}}(G^+_{RL_n} - G^-_{RL_n})\right) = t_{int}\sum_n (V_{x_n}(G^+_{RL_n} - G^-_{RL_n}))$$

A positive value of $\Sigma_p Q'_p$ implies that a net amount of charge equal to $\Sigma_p Q'_p$ has been subtracted from the first electrode across all the time periods $t_1$-$t_p$, while a negative value of $\Sigma_p Q'_p$ implies that a net amount of charge equal to $\Sigma_p Q'_p$ has been added to the first electrode across all the time periods $t_1$-$t_p$.

Combining equation 5 with the characteristic equation for a capacitor V=Q/C implies that the voltage difference $\Delta V_C$ that is stored in the integration capacitor $C_{int}$ once the $P^{th}$ time period $t_P$ has ended will be given by:

$$\Delta V_C = \frac{t_{int}}{C_{int}} \sum_n (V_{x_n}(G^+_{RL_n} - G^-_{RL_n})) \quad \text{(eq. 6)}$$

Thus, the voltage difference $\Delta V_C$ equals the desired MAC result for the case in which inputs may be positively weighted or negatively weighted, i.e., $\Sigma_n(V_{x_n}(G^+_{RL_n} - G^-_{RL_n}))$, scaled by a constant ($t_{int}/C_{int}$).

From equation 6, it can be seen that a current $V_{x_n}G^+_{RL_n}$ flowing through a positive memristor 101 of an $n^{th}$ row line $RL_n$ tends to increase $\Delta V_C$, while a current $V_{x_n}G^-_{RL_n}$ flowing through a negative memristor 101 of an $n^{th}$ row line $RL_n$ tends to decrease $\Delta V_C$. Thus, by controlling the relative sizes of $V_{x_n}G^+_{RL_n}$ and $V_{x_n}G^-_{RL_n}$, a positive or a negative weighting may be arbitrarily set for the input associated with the $n^{th}$ row line $RL_n$. Specifically, an $n^{th}$ input of a given MAC may be assigned a positive weighting by setting the conductance $G^+_{RL_n}$ of the positive memristor 101 of the $n^{th}$ row line $RL_n$ to a value that corresponds to the desired weight and setting the conductance $G^-_{RL_n}$ of the negative memristor 101 that is connected to the $n^{th}$ row line $RL_n$ to zero (or to a very low value). Conversely, an $n^{th}$ input of a given MAC may be assigned a negative weighting by setting the conductance of the negative memristor 101 of the $n^{th}$ row line $RL_n$ to a value that corresponds to the desired weight and setting the conductance of the positive memristor 101 that is connected to the $n^{th}$ row line $RL_n$ to zero (or to a very low value).

When a positive weighting is set for an $n^{th}$ input and a voltage is applied to the $n^{th}$ row line $RL_n$, a current will flow through positive memristor 101 and along the positive-weight column line CL+, but no current (or a very small current) will flow through the negative memristor 101 and along the negative-weight column line CL− since the conductance $G^-_{RL_n}$ of the negative memristor 101 is zero (or very low). Conversely, when a negative weighting is set for the $n^{th}$ input and a voltage is applied to the $n^{th}$ row line $RL_n$, a current will flow through negative memristor 101 and along the negative-weight column line CL−, but no current (or a very small current) will flow through the positive memristor 101 and along the positive-weight column line CL+ since the conductance $G^+_{RL_n}$ of the positive memristor 101 is zero (or very low). Thus, inputs that are assigned positive weights ultimately cause some charge to be subtracted from the integration capacitor $C_{int}$ (since they generate a current on the positive-weight column line CL+), while inputs that are assigned negative weights ultimately cause some charge to be added to the integration capacitor $C_{int}$ (since they generate a current on the negative-weight column line CL−). In other words, the expression $V_{x_n}(G^+_{RL_n}-G^-_{RL_n})$ from equation 6 reduces to $V_{x_n}G^+_{RL_n}$ for those inputs that are assigned positive weightings and $V_{x_n}G^-_{RL_n}$ for those inputs that are assigned negative weightings.

In certain examples, each input of a given MAC may have its associated positive and negative memristors 101 set independently from the memristors 101 of the other inputs of the same MAC, and therefore in such examples it is possible for one input of a MAC to be assigned a positive weight while another input of the same MAC is assigned a negative weight.

Although in the examples described above positive weightings are associated with subtracting charge from the integration capacitor $C_{int}$ (e.g., via the first current mirroring circuitry 301) and negative weightings are associated with adding charge to the integration capacitor $C_{int}$ (e.g., via the second current mirroring circuitry 302), this is merely one example and an opposite convention could be used.

In certain examples, the example electronic device 10 illustrated in FIG. 5 may include an artificial neural network ("ANN"). For example, the crossbar array 110, the row driver circuitry 200, and the column output circuits 310, may correspond to a first layer of the ANN. In such an example, each MAC of the crossbar array 110 may correspond to an induvial neuron. Specifically, each pair of column lines CL+ and CL− may correspond to an individual neuron, and the neuron may include each of the memristors 101 in the corresponding columns together with the column output circuit 310 of the corresponding columns. There may be additional layers of the ANN subsequent to the first layer, in which case the output $\overline{Y}=(y_1, y_2, \ldots, y_M)$ of the first layer may be fed to the second layer as an input thereof.

In particular, in certain examples, the output $\overline{Y}=(y_1, y_2, \ldots, y_M)$ of the first layer may be a digital output vector. In such examples, the example electronic device 10 illustrated in FIG. 5 may include the output circuitry 500, as well as the second layer 1000 and its associated input stage 2000 as described above and illustrated in FIG. 3. In such examples, the output circuitry 500, second layer 1000, and input stage 2000 may be configured in the same manner described above in relation to FIG. 3, and therefore duplicative description of these features is omitted.

As another example, the output $\overline{Y}=(y_1, y_2, \ldots, y_M)$ of the first layer may be an analog output vector. In such examples, the example electronic device 10 illustrated in FIG. 5 may include the output circuitry 600, as well as the second layer 1001 and its associated input stage 2001 as described above and illustrated in FIG. 4. In such examples, the output circuitry 600, second layer 1001, and input stage 2001 may be configured in the same manner described above in relation to FIG. 4, and therefore duplicative description of these features is omitted.

Figure 6:
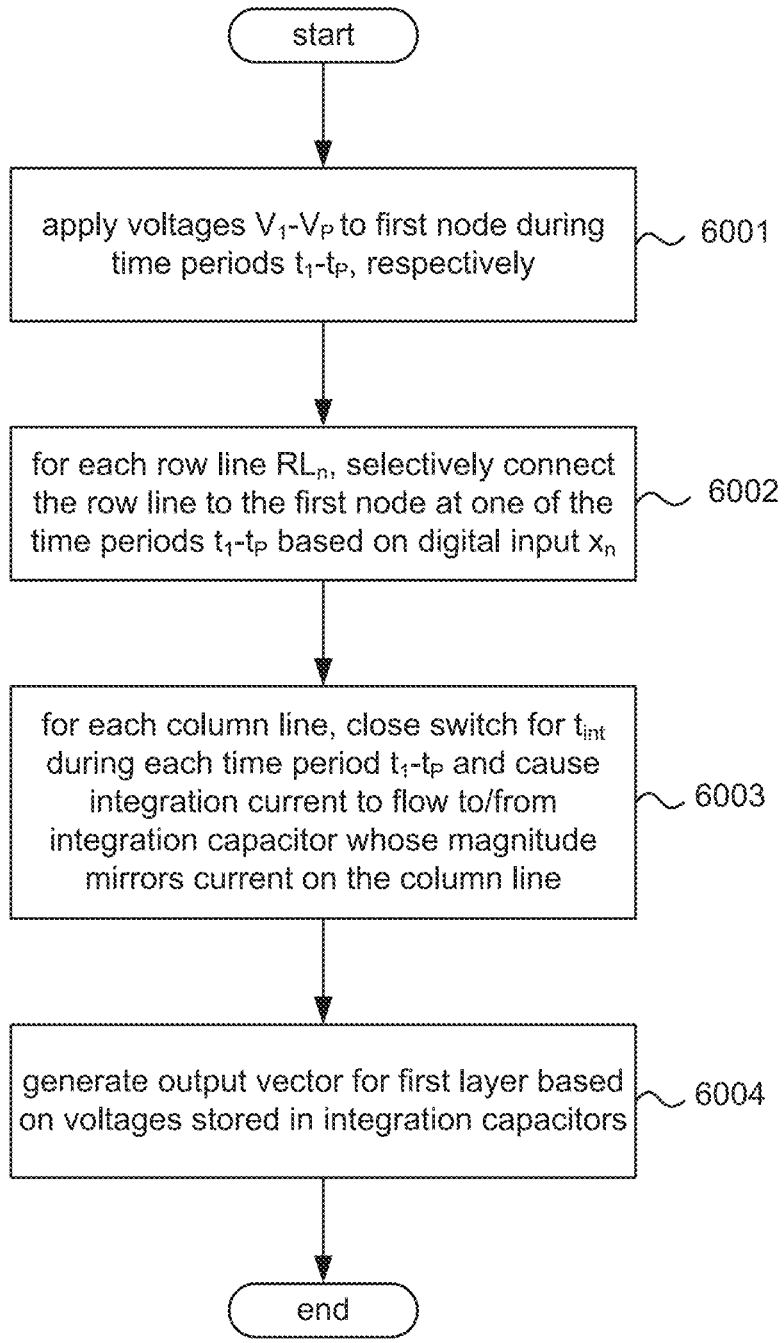
FIG. 6 is a process flow diagram illustrating an example method of operating an electronic device that includes memristor-based analog MACs.

FIG. 6 illustrates an example method of operating an electronic device. For example, the method may be for operating an artificial neural network that has a first layer comprising a crossbar array (such as the crossbar array 100 or 110) with row lines, column lines, and memristors that each are connected between one of the row lines and one of the column lines. The example method may be performed, for example, via one or more controllers of the electronic devices, such as, for example, the controller 400.

The example method includes applying a plurality of analog voltages to a first node during a plurality of time periods, respectively (see block 6001). For example, voltages $V_1$-$V_P$ may be applied to the first node during time period $t_1$-$t_P$, respectively, where P≥2.

The example method may also include, for each of the row lines, selectively connecting the row line to the first node during one of the plurality of time periods based on a digital input vector (see block 6002). For example, for each row line $RL_n$, the row line $RL_n$ may be selectively connected to the first node at one of the time periods $t_1$-$t_p$ based on digital input $x_n$ that corresponds to the row line $RL_n$. In particular, for each row line $RL_n$, the row line $RL_n$ may be connected to the first node at the timing $t_p$, where $p=x_n$. Connecting a given row line $RL_n$ to the first node in accordance with block 6002 may result in the voltage $V_p$ being applied to the given row line $RL_n$, since $V_p$ is applied to the first node during $t_p$ in accordance with block 6001.

The example method may also include, for each of the column lines, closing at least one switch corresponding to the column line for a specified amount of time ($t_{int}$) during each of the plurality of time periods, and, while the at least one switch is closed, causing an integration current to flow to or from an integration capacitor corresponding to the column line whose magnitude mirrors a current flowing on the column line (see block 6003). For example, the at least one switch of each of the column lines may be controlled in the manner described above by applying an integration control signal (such as Ctr_Int) to the switches. Specifically, the integration control signal may be pulsed to an active level during each of the time period $t_1$-$t_P$ with a pulse width equal to the specified amount of time ($t_{int}$).

In block 6003, the causing of the integration current to flow to or from the integration capacitor when the at least one switch is closed may be achieved via a current mirroring circuit (such as the current mirroring circuit 301) that is connected between the column line and the switch. For example, causing the integration current to flow to or from the integration capacitor when the at least one switch is closed may include applying a first voltage (e.g., Vss) to the current mirroring circuit at least while the switch is closed.

The example method may also include generating an output vector for the first layer based on the respective voltages that are stored in the integration capacitors of the column lines after an end of the plurality of time periods (see block 6004).

In certain examples, the crossbar array may further include second column lines that each correspond to one of the column lines and second memristors that each are connected between one of the row lines and one of the second column lines (such as in the crossbar array 310). In such examples, the method may further include at block 6003 for each of the column lines: while the at least one switch of the column line is closed, causing a second integration current to flow to or from the integration capacitor of the column line whose magnitude mirrors a current flowing on the one of the second column lines that corresponds to the column line, where the first integration current and the second integration current flow in opposite directions relative to the integration capacitor of the column line.

In certain examples, each neuron of the first layer is associated with one of the column lines and a corresponding one of the second column lines. In such examples, the example method may further comprise: setting a positive weight for a first given input of a given neuron by adjusting a resistance of one of the memristors that is connected to the associated column line, and setting a negative weight for a second given input of the given neuron by adjusting a resistance of one of the memristors that is connected to the associated second column line.

In certain examples, the output vector for the first layer is a digital output vector. In such examples, generating the output vector for the first layer at block 6004 may include feeding signals based on the respective voltages stored in the integration capacitors of the column lines after the end of the plurality of time periods to at least one analog-to-digital converter. In certain examples, the signals fed to the at least one analog-to-digital converter may be voltages sampled from the voltages stored in the integration capacitors by sample-and-hold circuits.

In certain examples, the output vector for the first layer is an analog output vector. In such examples, generating the output vector for the first layer at block 6004 may include feeding signals based on the respective voltages stored in the integration capacitors of the column lines after the end of the plurality of time periods to analog buffer circuitry. In certain examples, the signals fed to the analog buffer circuitry may be voltages sampled from the voltages stored in the integration capacitors by sample-and-hold circuits.

In the art, the term "memristor" may be used in certain contexts in a broad sense and may be used in certain contexts in a narrow sense. In one narrow sense, "memristor" may refer specifically to circuit elements that exhibit a non-linear relationship between electric charge and magnetic flux (or exhibit a relationship between the time integral of current and the time integral of voltage). In the broad sense, "memristor" refers broadly to any non-volatile memory element that is based on changing resistance states and is read by its resistance. Herein and in the appended claims, "memristor" is always used in the broad sense, unless specifically indicated otherwise; specifically, as used herein, "memristor" refers broadly to any non-volatile memory element that is based on changing resistance states and is read by its resistance. Thus, the memristors 101 may be formed by, for example, a memristor in the narrow sense of the term, a memory element that changes the resistance across a dielectric solid-state material, a phase-change memory element (sometimes referred to as PCM or PCRAM), a conductive-bridging memory element (sometimes referred to as CBRAM or a programmable metallization cell), a magnetoresistive memory element (sometimes referred to as MRAM), or the like.

In addition, in certain examples resistive elements that are not memristors may be used in place of the memristors 101 to connect the column lines and row lines in the crossbar array 100. Such resistive elements may be, for example, variable resistance resistors or fixed resistance resistors. Examples of a variable resistance resistor include a transistor operating in liner (ohmic) mode (in which case the channel resistance thereof may be varied by varying a voltage applied to the gate of the transistor), a circuit element that changes its resistance by changing a current path through the circuit element (for example, multiple resistors with different resistances and a switch that selects which of the resistors the current path flows through), and the like. Examples of fixed resistance resistors include poly resistors, laser-trimmed thin films, and the like. In certain example device 10 in which non-memristor resistive elements are substituted for the memristors 101, the other components of the example device 10 may be in the same configurations as those described above; in some such examples, additional components specific to the resistive elements may also be added as needed (e.g., gate lines for transistors, control lines for switches, etc.).

In examples in which memristors 101 are used or in which variable resistance resistors are used in place of the memristors 101, the weights that are assigned to inputs of the MACs may be dynamically adjusted by changing the conductances of the memristors 101 or variable resistance resistors. In examples in which fixed resistance resistors are used in place of the memristors, the weights that are assigned to the inputs of the MACs may be set (e.g., during manufacture) and may thereafter remain fixed.

Throughout this disclosure and in the appended claims, occasionally reference may be made to "a number" of items. Such references to "a number" mean any integer greater than or equal to one. In other words, "a number" means the same thing as "at least one". When "a number" is used in this way, the word describing the item(s) may be written in pluralized form for grammatical consistency, but this does not necessarily mean that multiple items are being referred to. Thus, for example, a phrase such as "a number of processors, wherein the processors . . . " could encompass both one processor and multiple processors, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form for grammatical consistency, but this does not necessarily mean that only one items is being referred to. Thus, for example, a phrase such as "a processor, wherein the processor . . . " could encompass both one processor and multiple processors, notwithstanding the use of the singular form.

Occasionally the phrase "and/or" is used herein in conjunction with a list of items. This phrase means that any combination of items in the list—from a single item to all of the items and any permutation in between—may be included. Thus, for example, "A, B, and/or C" may include any one of: {A}, {B}, {C}, {A, B}, {A, C}, {C, B}, and {A, C, B}.

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently.

While the above disclosure has been shown and described with reference to the foregoing examples, it should be understood that other forms, details, and implementations may be made without departing from the spirit and scope of this disclosure.

What is claimed is:

1. An electronic device comprising:
    a crossbar array comprising row lines, column lines, and memristors that each are connected between one of the row lines and one of the column lines;
    row driver circuitry applying a plurality of analog voltages to a first node during a plurality of time periods, respectively, and, for each of the row lines, selectively connecting the row line to the first node during one of the plurality of time periods based on a digital input vector; and
    for each of the column lines, a column output circuit that includes:
        an integration capacitor,
        a switch that is controlled by an integration control signal, and
        current mirroring circuitry flowing an integration current to or from an electrode of the integration capacitor whose magnitude mirrors a current flowing on the corresponding column line, when the switch is closed, wherein the integration control signal closes the switch for a specified amount of time during each of the plurality of time periods;
    analog-to-digital conversion circuitry generating digital output value for each of the column output circuits based on respective voltage differences stored in the integration capacitors of the column output circuits, wherein a first layer of a neural network comprises the digital output value for each of the column output circuits;

wherein the digital output value for each of the column output circuits is generated after an end of the plurality of time periods; and wherein the crossbar array and the row driver circuitry also form the first layer of the neural network, the respective digital output values of the column output circuits form a digital output vector of the first layer of the neural network, and the digital output vector of the first layer of the neural network is fed as an input to a second layer of the neural network.

2. The electronic device of claim 1, wherein, for each of the column output circuits, an output signal thereof is based on a voltage difference stored in the integration capacitor after an end of the plurality of time periods.

3. The electronic device of claim 1, further comprising:

a sample-and-hold circuit for each of the column output circuits, each of the sample-and-hold circuits being connected to the integration capacitor of the corresponding column output circuit and sampling a voltage of an electrode of the integration capacitor after the end of the plurality of time periods and feeding the sampled voltage to the analog-to-digital conversion circuitry.

4. The electronic device of claim 1, further comprising:

analog buffer circuitry outputting analog output value for each of the column output circuits based on respective voltage differences stored in the integration capacitors of the column output circuits after an end of the plurality of time periods.

5. The electronic device of claim 1, wherein the crossbar array and the row driver circuitry also form the first layer of the neural network, with each of the column lines corresponding to an individual neuron of the neural network.

6. The electronic device of claim 1, wherein the row driver circuitry includes:

a digital-to-analog converter applying the plurality of analog voltages to the first node by applying a ramp voltage signal whose voltage changes each of the plurality of time periods to the first node, and a switching circuit for each of the row lines, where each of the switching circuits stores a digital value from the digital input vector and connects the first node to the corresponding row line during one of the plurality of time periods that corresponds to the stored digital value.

7. The electronic device of claim 5, wherein the crossbar array and the row driver circuitry also form the first layer of the neural network, with each neuron of the first layer being associated with one of the first column lines and its corresponding second column line, the electronic device sets a positive weight for a first given input of a given neuron by adjusting a resistance conductance of one of the memristors that is connected to the associated first column line, and the electronic device sets a negative weight for a second given input of the given neuron by adjusting a conductance of one of the memristors that is connected to the associated second column line.

* * * * *